US010615802B2

(12) United States Patent
Betz et al.

(10) Patent No.: US 10,615,802 B2
(45) Date of Patent: Apr. 7, 2020

(54) DYNAMIC PARAMETER OPERATION OF AN FPGA

(71) Applicant: ALTERA CORPORATION, San Jose, CA (US)

(72) Inventors: Vaughan Betz, Toronto (CA); Shuze Zhao, Toronto (CA); Ibrahim Ahmed Ibrahim, Toronto (CA); Olivier Trescases, Toronto (CA)

(73) Assignee: THE GOVERNING COUNCIL OF THE UNIVERSITY OF TORONTO, Toronto (CA)

( * ) Notice: Subject to any disclaimer, the term of this patent is extended or adjusted under 35 U.S.C. 154(b) by 0 days.

(21) Appl. No.: 16/085,096

(22) PCT Filed: Feb. 10, 2017

(86) PCT No.: PCT/US2017/017495
§ 371 (c)(1),
(2) Date: Sep. 17, 2018

(87) PCT Pub. No.: WO2017/160434
PCT Pub. Date: Sep. 21, 2017

(65) Prior Publication Data
US 2019/0115924 A1 Apr. 18, 2019

Related U.S. Application Data

(63) Continuation of application No. 15/199,329, filed on Jun. 30, 2016, now abandoned.
(Continued)

(51) Int. Cl.
*H03K 19/173* (2006.01)
*H03K 19/17764* (2020.01)
(Continued)

(52) U.S. Cl.
CPC . *H03K 19/17764* (2013.01); *H03K 19/17784* (2013.01); *H03K 19/1774* (2013.01); *H03K 19/17728* (2013.01)

(58) Field of Classification Search
CPC ......... H03K 19/17728; H03K 19/1774; H03K 19/17764; H03K 19/17784
See application file for complete search history.

(56) References Cited

U.S. PATENT DOCUMENTS 6,769,107 B1 7/2004 Watkins
7,444,181 B2 10/2008 Shi et al.
(Continued)

OTHER PUBLICATIONS

C. Chow, L. Tsui, P. Leong, W. Luk, and S. Wilton, "Dynamic voltage scaling for commercial fpgas," in Field-Programmable Technology, 2005. Proceedings. 2005 IEEE International Conference on, Dec. 2005, pp. 173-180.
(Continued)

*Primary Examiner* — Alexander H Taningco
*Assistant Examiner* — Kurtis R Bahr
(74) *Attorney, Agent, or Firm* — Bhole IP Law; Anil Bhole; Marc Lampert (57) ABSTRACT

Methods and systems for operating a programmable logic fabric (16) including a dynamic parameter scaling controller (22) that tracks an operating parameter that functions at multiple operating conditions by maintaining the operating parameter while cycling through multiple operating conditions during a calibration mode using the calibration configuration for the programmable logic fabric (16). The dynamic parameter scaling controller (22) also stores one or more functional values for the operating parameter in a calibration table. The dynamic parameter scaling controller (22) also operates the programmable logic fabric (16) using a design configuration using dynamic values for the oper-
(Continued)

ating parameter based at least in part on the one or more operating conditions.

15 Claims, 6 Drawing Sheets

Related U.S. Application Data (60) Provisional application No. 62/310,565, filed on Mar. 18, 2016.

(51) Int. Cl.
*H03K 19/17784* (2020.01)
*H03K 19/17736* (2020.01)
*H03K 19/17728* (2020.01)

(56) References Cited

U.S. PATENT DOCUMENTS

| | | | | |
|---|---|---|---|---|
| 7,483,806 | B1* | 1/2009 | Arsovski | G06F 1/206 |
| | | | | 702/132 |
| 7,814,350 | B2* | 10/2010 | Gaskins | G06F 1/206 |
| | | | | 713/300 |
| 8,102,187 | B2 | 1/2012 | Batra et al. | |
| 8,698,516 | B2 | 4/2014 | Rahim et al. | |
| 8,750,065 | B2* | 6/2014 | Merkel | G11C 7/04 |
| | | | | 365/148 |
| 9,015,023 | B2* | 4/2015 | Tuan | G06F 17/5054 |
| | | | | 703/13 |
| 9,081,501 | B2* | 7/2015 | Asaad | G06F 15/76 |
| 9,276,563 | B2* | 3/2016 | Bansal | H03K 3/012 |
| 9,316,684 | B2* | 4/2016 | Sato | G01R 31/2884 |
| 9,342,403 | B2* | 5/2016 | Keppel | G06F 11/106 |
| 9,413,344 | B2* | 8/2016 | Bowman | H03K 5/13 |
| 9,618,999 | B1* | 4/2017 | Bertran | G06F 1/3206 |
| 9,645,191 | B2 | 5/2017 | Walker | |
| 2005/0182578 | A1* | 8/2005 | Dolwin | G06F 1/3203 |
| | | | | 702/75 |
| 2005/0289485 | A1* | 12/2005 | Willis | G01R 31/318364 |
| | | | | 716/104 |
| 2007/0080702 | A1* | 4/2007 | Fishman | G01R 31/3171 |
| | | | | 324/750.11 |
| 2009/0273361 | A1 | 11/2009 | Batra et al. | |
| 2013/0013247 | A1 | 1/2013 | Sato et al. | |
| 2013/0043902 | A1 | 2/2013 | Rahim et al. | |
| 2016/0054379 | A1* | 2/2016 | Walker | G01R 31/025 |
| | | | | 324/750.03 |

OTHER PUBLICATIONS

J. Levine, E. Stott, G. Constantinides, and P. Cheung, "Online measurement of timing in circuits: For health monitoring and dynamic voltage & frequency scaling," in Field-Programmable Custom Computing Machines (FCCM), 2012 IEEE 20th Annual International Symposium on, Apr. 2012, pp. 109-116.

J.M Levine, E. Stott, G.A. Constantinides and , P.Y.K Cheung, "SMI: Slack measurement insertion for online timing monitoring in fpgas," in Field Programmable Logic and Applications (FPL), 2013 23rd International Conference on, Sep. 2013, pp. 1-4.

J. M. Levine, E. Stott, and R Y. Cheung, "Dynamic voltage & frequency scaling with online slack measurement," in Proceedings of the 2014 ACM/SIGDA International Symposium on Field-programmable Gate Arrays, ser. FPGA '14. New York, NY, USA: ACM, 2014, pp. 65-74. [Online]. Available: http://doi.acm.org/10.1145/2554688.2554784.

International Search Report corresponding to PCT/US2017/017495; Korean Intellectual Property Office; dated May 22, 2017.

Written Opinion of the International Searching Authority corresponding to PCT/US2017/017495; Korean Intellectual Property Office; dated May 22, 2017.

\* cited by examiner

DYNAMIC PARAMETER OPERATION OF AN FPGA

CROSS-REFERENCE TO RELATED APPLICATIONS

The present application claims the benefit of U.S. Provisional Application No. 62/310,565, entitled "DYNAMIC PARAMETER OPERATION OF AN FPGA" and filed Mar. 18, 2016, the disclosure of which is incorporated herein by reference in its entirety and for all purposes.

BACKGROUND

The present disclosure relates generally to integrated circuits, such as programmable logic devices. More particularly, the present disclosure relates to dynamically changing parameters of operation of programmable logic devices, such as field programmable gate arrays (FPGAs).

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Integrated circuits (ICs) take a variety of forms. For instance, programmable logic devices such as field programmable gate arrays (FPGAs) are integrated circuits that include logic that may be programmed (e.g., configured) after manufacturing to provide any desired functionality that the FPGA is designed to support. Thus, FPGAs contain programmable logic or logic blocks that may be configured to perform a variety of functions on the FPGAs, according to a designer's specific design. A manufacturer of the FPGA may determine a voltage level that is likely to work for worst-case scenario operating conditions (e.g., a minimum voltage that could allow that type of integrated circuit to operate at a given temperature) for a number of designs. This voltage level tends to be pessimistic to account for the variety of designs that are possible to implement using the FPGA.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

Present embodiments relate to systems, methods, and devices for dynamically modifying operating parameters (e.g., voltage or frequency) of an FPGA based at least in part on operating conditions (e.g., temperature) of a specific design of the FPGA. To determine the dynamic parameters, a controller, such as a dynamic voltage and frequency scaling (DVFS) controller or a dynamic parameter scaling controller, may be used to run calibrations using calibration configurations to determine actual response of the portions of the FPGA to be used rather than relying on pessimistic worst-case scenarios to set a parameter (voltage) that may be considerably higher than a lower value the parameter may operate properly. For example, power may be wasted in the FPGA due to pessimistic estimations rather than actual calibrations.

Various refinements of the features noted above may exist in relation to various aspects of the present disclosure. Further features may also be incorporated in these various aspects as well. These refinements and additional features may exist individually or in any combination. For instance, various features discussed below in relation to one or more of the illustrated embodiments may be incorporated into any of the above-described aspects of the present invention alone or in any combination. Again, the brief summary presented above is intended only to familiarize the reader with certain aspects and contexts of embodiments of the present disclosure without limitation to the claimed subject matter.

BRIEF DESCRIPTION OF THE DRAWINGS

Various aspects of this disclosure may be better understood upon reading the following detailed description and upon reference to the drawings in which.

DETAILED DESCRIPTION OF SPECIFIC EMBODIMENTS

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

As discussed in further detail below, embodiments of the present disclosure relate generally to circuitry for enhancing performance of machine-readable programs implemented on an integrated circuit (IC). Indeed, such an IC may include a programmable logic device, such as a Field Programmable Gate Array (FPGA). Field Programmable Gate Arrays (FPGAs) can outperform microprocessors and Digital Signal Processors (DSPs) in many applications, thanks to the ability to implement massively parallel algorithms. Since FPGAs can be reprogrammed to accommodate evolving standards, FPGAs may be used without utilizing custom manufacturing that result in relatively high non-recurring engineering costs and development time of Application-Specific Digital ICs (ASICs). Thus, FPGAs are widely used in telecom, medical, military and cloud computing applications among numerous applications.

However, the flexibility of FPGAs comes at a cost. FPGAs may consume much more dynamic power than (e.g., in some cases, ten times the dynamic power of) an ASIC performing the same task. Furthermore, because FPGAs can be programmed to perform any digital function gives rise to some unique challenges in designing a dynamic voltage and frequency scaling (DVFS) control system to reduce power consumption. Unlike microprocessors, speed-limiting paths of a specific FPGA IC are unknown at manufacturing time since these critical paths (and/or hard block usage and configurations) may vary based on a design implementation configured into the FPGAs. Thus, mimicking the critical paths (and/or hard block usage and configurations) and setting the minimum core voltage for the DVFS control system increases complexity to power management in FPGAs that is not present in microprocessors.

Thus, FPGA designers may instead choose to operate each IC at its rated nominal voltage. Furthermore the designers may choose a clock frequency at or below a limit predicted by a Computer-Aided Design (CAD) tool's timing analysis. This timing analysis is usually pessimistic and conservative, using worst-case models for process corners, on-chip voltage drop, temperature and aging. However, in a large number of operating temperatures (and other parameters) of chips and systems, the conservative supply voltage may be safely reduced by a significant amount below a single voltage level that is deemed safe for all parameters to obtain energy savings. Another benefit at operating at lower voltages includes reduced impact of aging effects, such as Bias-Threshold Instability (BTI), to improve the chip lifetime by operating at a voltage lower than the single voltage level.

In particular, the following discussion relates to the reduction of power consumption for field programmable gate arrays (FPGA) by dynamically varying an operating voltage as a function of properties of specific design, an integrated circuitry chip on which the design is operating, current draw of the chip, or other operating parameters of the design and/or chip. In some embodiments, other parameters of operation, such as frequency of operation, may be varied in addition or as an alternative to the voltage variance. These modifications may be made based upon performance metrics or other characteristics of the machine-readable program. One way to reduce power consumption is to reduce an operating voltage, but a minimum voltage may fluctuate with temperature, current, frequency, and other parameters. The determination of the minimum safe operating voltage is performed by a power management system including hardware and software. For example, the software may include a Computer-Aided Design (CAD) system.

The power management system analyzes a specific design to determine the speed-limiting paths, and creates a "calibration design" that contains replicas of these paths using the same physical resources (wires, lookup tables (LUTs), etc.) for a number of these paths. The replicas may actually be exact replicas. Furthermore, the number of these paths may include only a few or may include a majority of these paths.

The calibration design also includes test circuitry to exercise the paths and compare their output to their expected outputs. The test circuitry may also include heater and/or load circuitry to generate heat to raise the die temperature and to draw current to increase the voltage drop seen on chip. The power management hardware may also include some hardware intellectual property (IP) cores programmed in the FPGA and some separate power management chips on the circuit board which together create a calibration table of safe operating voltage in relation to other parameters. The calibration table is stored in flash memory or other memory when the device is powered up.

To create the calibration table, the power management system varies the one parameter of operation (e.g., frequency of operation of the design) for through various possible values of other parameters (e.g., voltages and temperatures). The power management system also tracks the lowest voltage (or other parameters) at which the calibration design replica paths still function correctly. The load circuitry is also controlled by the power management hardware in order to change the die temperature, and optionally to change the load current for various measurements. Once the calibration table has been populated, the power management system triggers a re-programming of the FPGA with the end-user-specific design.

As the end-user-specific design is running, the power management system continuously monitors the FPGA die temperature and load current, and by appropriate look-ups and modifies the FPGA voltage to the minimum safe value. In some embodiments, the minimum safe value may be adjusted using a guardband added to the voltage to ensure that the voltage is permissible.

Figure 1:
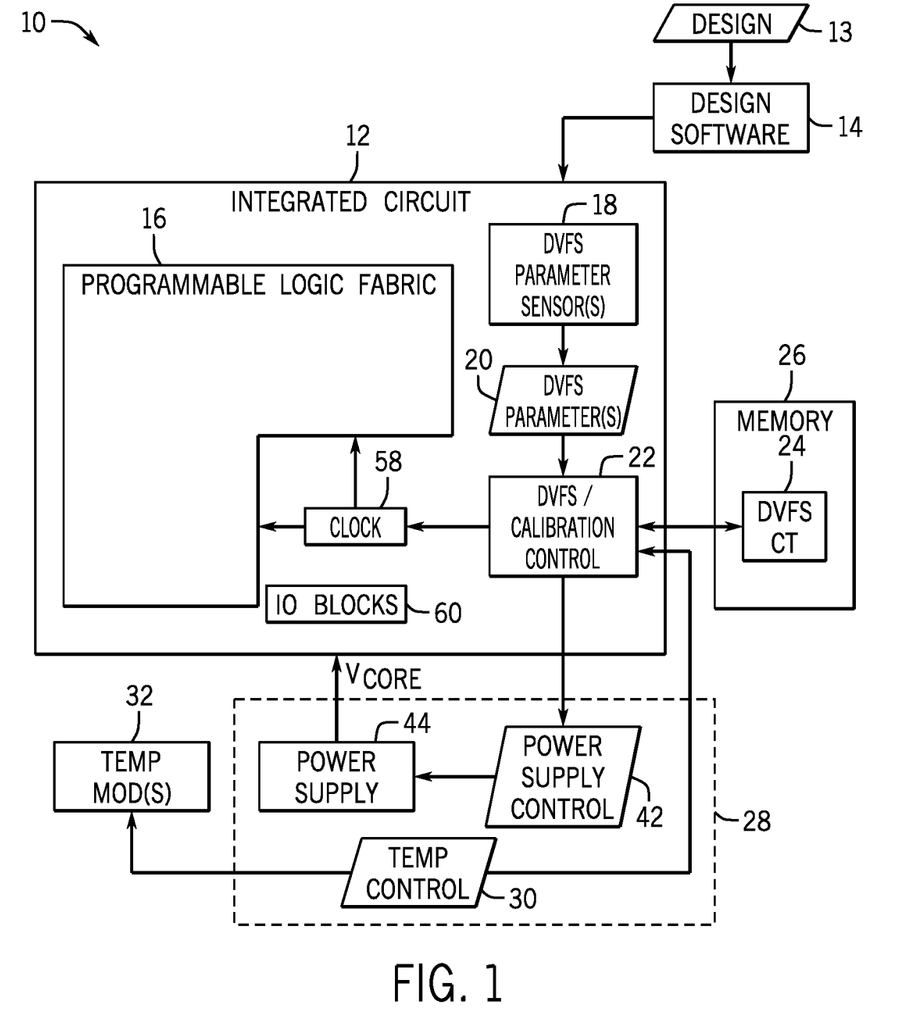
FIG. 1 is a block diagram of an FPGA system that utilizes dynamic operating parameters based on operating conditions, in accordance with an embodiment.

With the foregoing in mind, FIG. 1 illustrates a block diagram of a system 10 that includes dynamic voltage and frequency scaling (DVFS) control circuitry. As discussed previously, a designer may desire to implement functionality on an integrated circuit 12 (IC, such as a field programmable gate array (FPGA)). The designer may specify a high-level design 13 to be implemented, such as an OpenCL program, which may enable the designer to more efficiently and easily provide programming instructions to implement a set of programmable logic for the integrated circuit 12 without requiring specific knowledge of relatively low-level computer programming languages (e.g., Verilog or VHDL). For example, because OpenCL is quite similar to other high-level programming languages, such as C++, designers of programmable logic familiar with such programming languages may have a reduced learning curve than designers that are required to learn unfamiliar low programming languages to implement new functionalities in the IC.

The designers may implement their high-level designs using design software 14, such as a version of Quartus by Altera™. The design software 14 may include Computer-Aided Design (CAD) software to aid in generation of a design configuration in the integrated circuit 12 to implement the design. In some embodiments, the CAD software may be used in creating the design 13. The design software 14 may include a compiler to convert the high-level design 13 into a low-level design that may be stored in the integrated circuit 12 and/or separate memory for use in integrated circuit 12 by programming one or more gates in a programmable logic fabric 16 to cause the integrated circuit 12 to behave in a manner based at least in part on the design 13.

As discussed previously, since FPGA performance can fluctuate based on numerous parameters, such as specific design, specific chip, temperature, voltage levels, and frequency of operation, some CAD tools in the CAD software have been pessimistic to guarantee proper operation under worst-case conditions, such as process variation, operating temperature, noise and IR drop. Process variation includes manufacturing defects that can be classified as variation between devices or variation within devices. Imperfections in the fabrication process result in non-consistent dopant concentrations, oxide thickness fluctuations, stress variation, and other effects that effectively cause transistors performance to vary in the FPGA.

As will be discussed below, the design software 14 also generates a calibration configuration for the integrated circuit 12 for determining acceptable DVFS level. This calibration configuration may be used to determine how the integrated circuit 12 behaves in a variety of situations by simulating or reproducing at least the critical paths of the design 13. To determine operation of the integrated circuit 12, the system 10 includes parameter sensor(s) 18. For example, the parameter sensor(s) 18 may include temperature sensors, voltage sensing elements, frequency sensing elements, load current sensing elements, and/or other operating parameters. The parameter sensor(s) 18 may be located entirely on the integrated circuit 12, partly on the integrated circuit 12 and partly off-chip, or entirely off-chip. These parameter sensor(s) 18 identify DVFS parameters 20. For instance, one of the parameter sensor(s) 18 may be a temperature sensor that is not integrated into the integrated circuit 12, but that may identify the temperature of the integrated circuit 12 as one of the DVFS parameters 20. Furthermore, the parameter sensor(s) 18 may include error checkers that determine whether data injected in the FPGA is passed through critical paths properly under the operating conditions.

For example, the parameter sensor(s) 18 (e.g., error checkers) may determine that the integrated circuit 12 does not produce a correct result based at least in part on an adjusted supply voltage. For example, the correct result may be determined from a sink register. The DVFS parameters 20 are passed to DVFS calibration control 22 that tracks results based on DVFS parameters 20 and whether results are proper or not. This information is stored in a DVFS calibration table (CT) 24 that is saved in memory 26 to enable the DVFS calibration control 22 to modify operating parameters of the integrated circuit 12 during operation of the integrated circuit 12 using the design 13 based at least in part on the results from the calibration stored in the calibration table 24 according to one or more parameters determined at the time of operation. The memory 26 may be stored in the integrated circuit 12 and/or some location outside of the integrated circuit 12, such as a host computer used to run the design software 14. The calibration table 24 may include a table that is a single dimension table (i.e., an array). For example, the table may include voltages at which the specific design 13 functions properly within the specific integrated circuit 12 irrespective of other operating parameters. Additionally or alternatively, the calibration table 24 may include a table of values indexing more than a single parameter. For example, the calibration table 24 may include indications of available voltages for a current temperature. Moreover, the calibration table 24 may also include frequency information that indicates which voltage at the temperature may still result in correct results according to a frequency of operation. Thus, the voltage may be determined based at least in part on a sensed temperature and a frequency of operation. Moreover, the frequency may also be determined based at least in part on the sensed temperature and the supply voltage.

To enable variance of the operating parameters of the integrated circuit 12 during a calibration phase, the DVFS calibration control 22 may send instructions to parameter control 28. For instance, the DVFS calibration control 22 may send a temperature control signal 30 that controls temperature modulators 32 that change a temperature under which the integrated circuit 12 is tested in a calibration phase. The temperature modulators 32 may be at least partially implemented outside the integrated circuit 12 as external heaters. For example, the temperature modulators 32 may include heat guns. Additionally or alternatively, the temperature modulators 32 may be at least partially implemented in the integrated circuit 12. For example, the temperature modulators 32 may include flip-flop chain-based logic chains configured to act as programming heaters.

Figure 2:
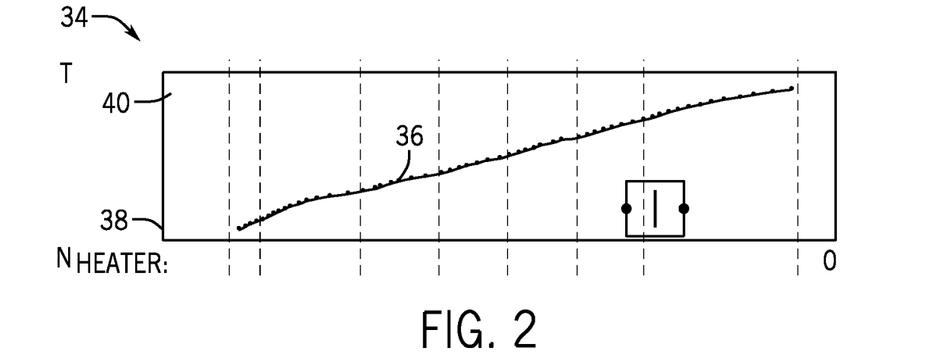
FIG. 2 is a graph of temperature changes relative to temperature modulators of FIG. 1, in accordance with an embodiment.

FIG. 2 illustrates a graph 34 that may be used to cycle through possible temperature levels. As illustrated, a temperature 36 may be selectable between a minimum temperature tested 38 and a maximum temperature tested 40. To increase the temperature 36, a number of temperature modulators 32 used may be increased and/or at least some of the temperature modulators 32 may produce more heat for the higher temperatures.

Figure 3A:
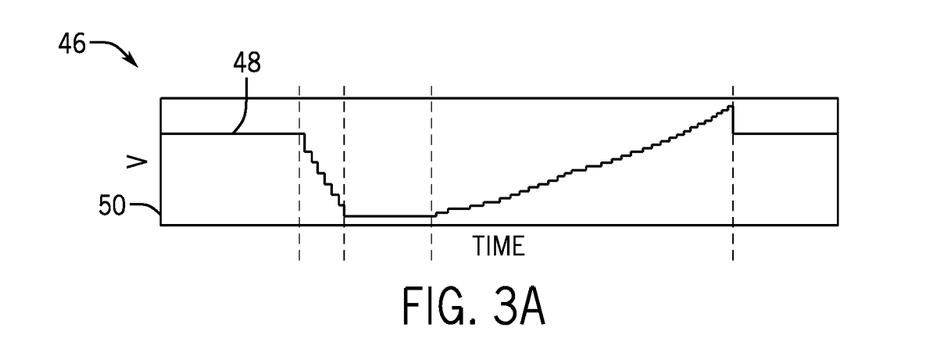
FIG. 3A is a graph of a voltage cycling for testing of operating parameters of the FPGA system of FIG. 1, in accordance with an embodiment.
Figure 3B:
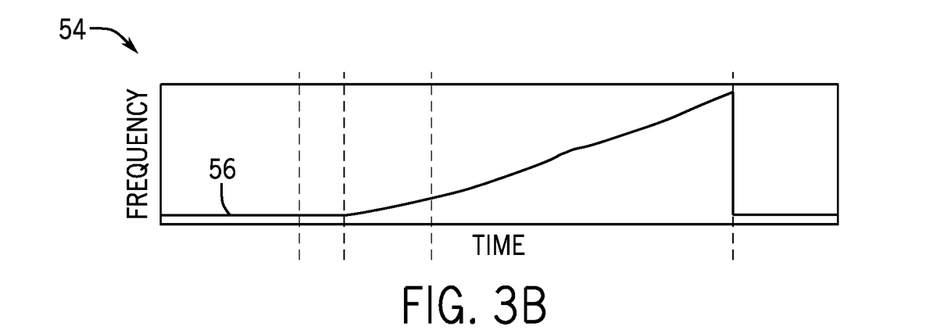
FIG. 3B is a graph of a frequency cycling for testing of operating parameters of the FPGA system of FIG. 1, in accordance with an embodiment.

Returning to FIG. 1, the parameter control 28 may also control other parameters. For example, the DVFS calibration control 22 may send a power supply control signal 42 that causes a power supply 44 to supply a voltage 48 $V_{core}$ to the integrated circuit 12. FIG. 3A illustrates a graph 46 of voltages through which the power supply 44 may cycle through during the calibration. For example, each cycle may be deployed at each temperature to be tested between the minimum temperature tested 38 and the maximum temperature tested 40. The voltage 48 is gradually reduced to a minimum working voltage 50. In some embodiments, the voltage 48 is reduced until the system experiences an error, and the last error-free voltage is set as the minimum working voltage 50. In some embodiments, the voltage 48 may then be increased while modifying other parameters, such as frequency of operation for the system. FIG. 3B illustrates a graph 52 of system frequency 56 that is increased at each voltage until an error occurs. The system frequency 56 may be the frequency of a clock 58 of FIG. 1 that is used to control operation of the integrated circuit 12. Returning to FIG. 3B, for each voltage 48, corresponding error-free frequencies 56 may be stored in the calibration table 24. Thus, the voltages 48 and corresponding error-free frequencies 56 working frequencies may be determined and stored for each temperature level to be tested as indicated in FIG. 2. Although the foregoing discusses setting a temperature while sweeping through voltage and frequencies, some embodiments may choose any parameter of operation while sweeping through other parameters of operation.

Returning to FIG. 1, the integrated circuit 12 also includes IO blocks 60 that may be used to write data to the integrated circuit 12 and/or read data from the integrated circuit 12. The integrated circuit 12 may also include hard blocks such as random accessible memory (RAM) blocks, digital signal processing (DSP) blocks, and/or other logical blocks that may be included in the calibration configuration to determine when these blocks fail due to certain parameters (e.g., voltage, current draw) in certain modes that cause the system to be unable to function properly for certain parameters. The calibration table 24 will track these values as well as those that do not rely on the hard blocks.

Figure 4:
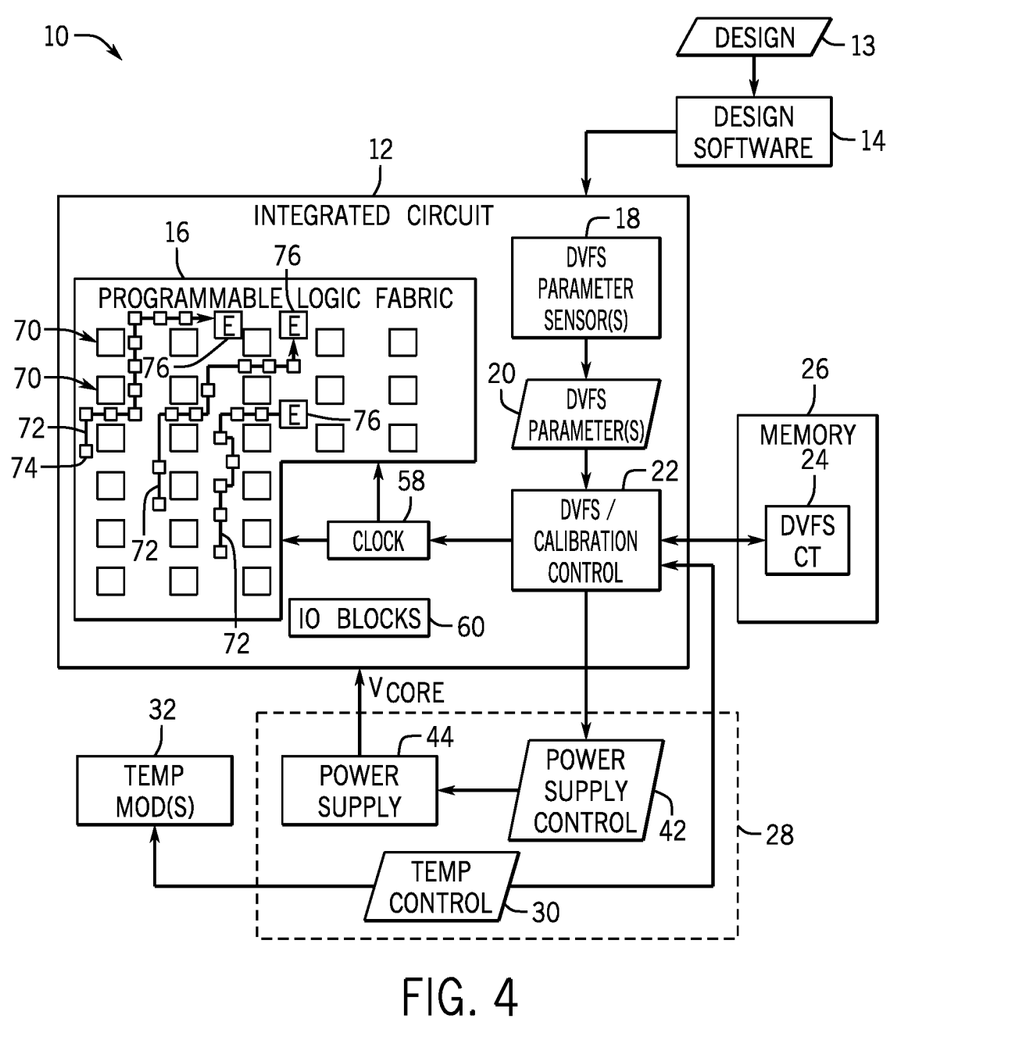
FIG. 4 is a block diagram illustrating heaters for use in generating the temperature of FIG. 3A and their relation to critical paths of the FPGA system of FIG. 1, in accordance with an embodiment.

FIG. 4 illustrates a schematic view of the system 10 illustrating temperature modulators 32 distributed throughout the programmable logic fabric. In the illustrated embodiment, the temperature modulators 32 are located on the integrated circuit 12 as heaters 70 that are distributed throughout the integrated circuit 12. As previously discussed, the heaters 70 may include flip-flop chain-based logic chains in the programmable logic fabric 16. A number of heaters 70 used to heat the die of the integrated circuit 12 may vary according to the temperature 36 of FIG. 2. Thus, the heaters 70 may be used to achieve each of the temperatures through which the calibration is performed.

Figure 5:
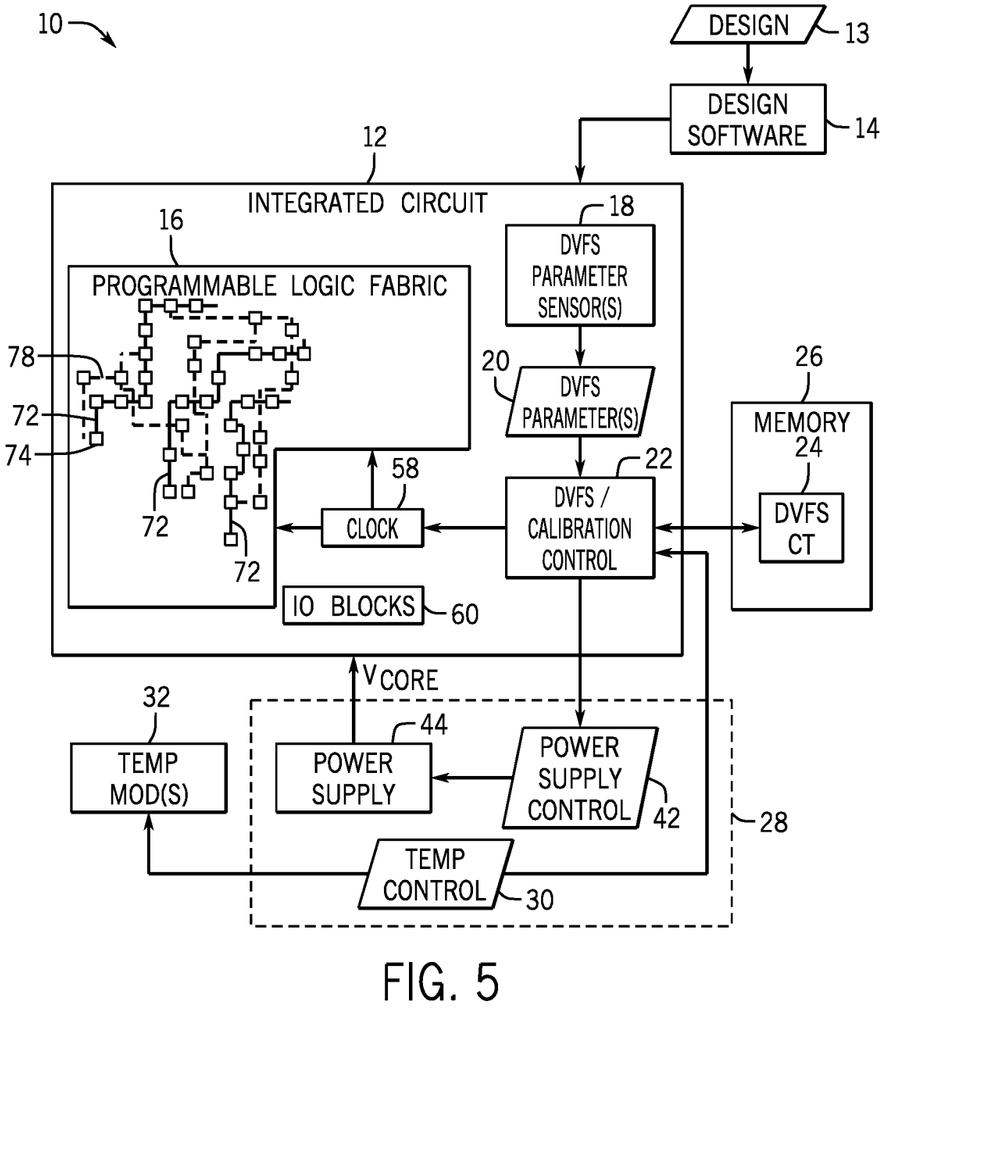
FIG. 5 is a block diagram illustrating critical paths and less-critical paths of the FPGA system of FIG. 1, in accordance with an embodiment.

Furthermore, the heaters 70 may be any circuitry that is not used for critical paths 72 that are used to simulate or replicate paths that are to be used by the design 13 during usage of the integrated circuit 12. The critical paths 72 include one or more gates that are used in that would be expected to result in a longest overall duration. Each critical path includes error checking 76 determining whether the critical path 72 functions properly at the current operating conditions. However, measuring information based only on a most critical path is less robust than testing less critical paths since most-critical-path-only testing ignores within-die variation. Thus, calibration procedures may be executed using one or more critical paths. The number of critical paths to be used may be determined based on the specific design. For example, FIG. 5 illustrates an embodiment of the integrated circuit 12 with additional less-critical paths 78. Each additional path to be tested during calibration increases calibration duration but increases flexibility and possibility of power reduction and/or enhanced performance.

Figure 6:
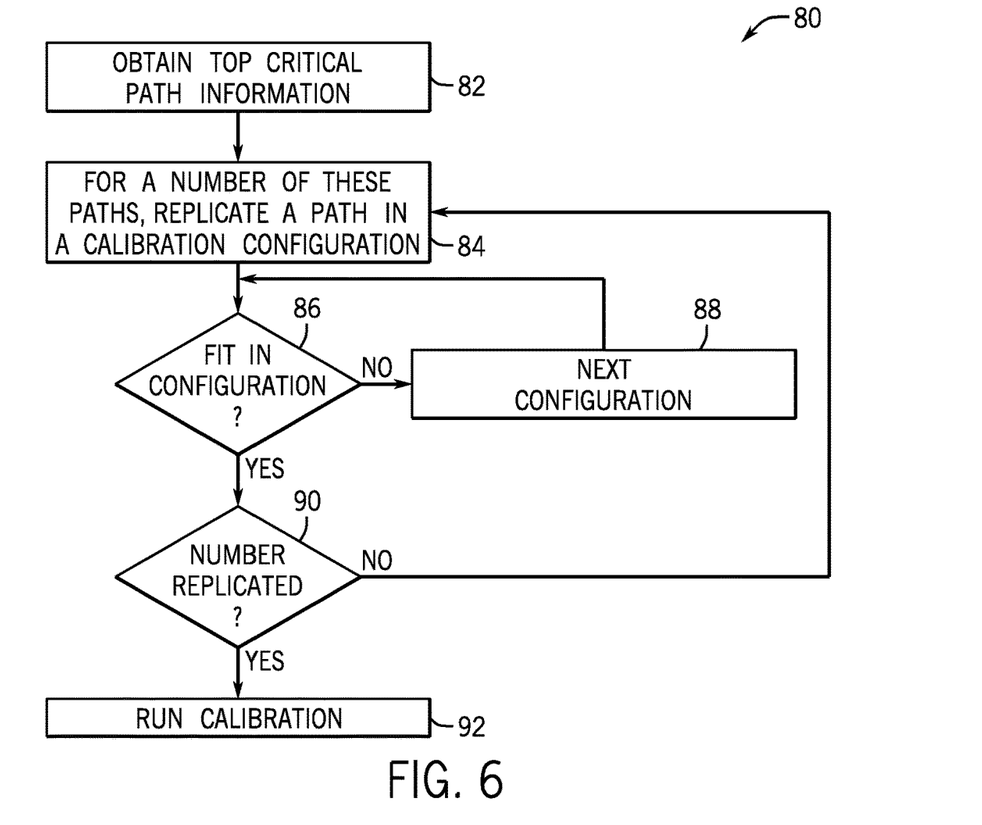
FIG. 6 illustrates a flow diagram illustrating a process for generating calibration configurations for the FPGA system of FIG. 1, in accordance with an embodiment.

FIG. 6 illustrates a flow diagram view of a process 80 for generating calibration configuration(s) for calibrating the integrated circuit 12 to enhance performance and power savings. The design software 14 running on a host computer or other device obtains top critical path information 82 for a number of critical paths in the design 13 (block 82). For a number of these paths, the design software 14 replicates the paths in a calibration configuration (block 84). Replication may also include creating additional components for each path including exercise, sensitization, and error detection components. The exercise components inject data into the critical paths, sensitization determines results of the data after passing through the critical paths, and the error detection components determine whether the critical paths react to the data properly. As discussed above, a higher number of paths increases obtained information and potential power savings and/or enhanced performance. However, a higher number of paths also increases calibration duration. The design software 14 determines whether the current critical path fits into the calibration configuration (block 86). The calibration configuration may include more than a single configuration. If all critical paths to be included in the calibration are able to fit into a single configuration with corresponding exercise, sensitization, and error detection components for each critical path, a single calibration configuration may be deployed. However, if the critical paths cannot physically coexist in the FPGA, the critical paths may be stored in multiple configurations. Multiple configurations also increases a calibration duration but provides reliable results that single out each path determining whether each critical path 72 is functioning properly at the operating conditions. If the critical path 72 is to be tested but cannot fit into a current configuration, checking the next configuration includes creating a new calibration configuration.

The design software 14 determines whether each of the critical paths has been replicated in a calibration configuration (block 90). If not, the design software 14 replicates the remaining critical paths to be tested in a calibration configuration. If all critical paths to be tested have been included, the calibration of the integrated circuit 12 may be performed using the one or more calibration configurations (block 92).

Figure 7:
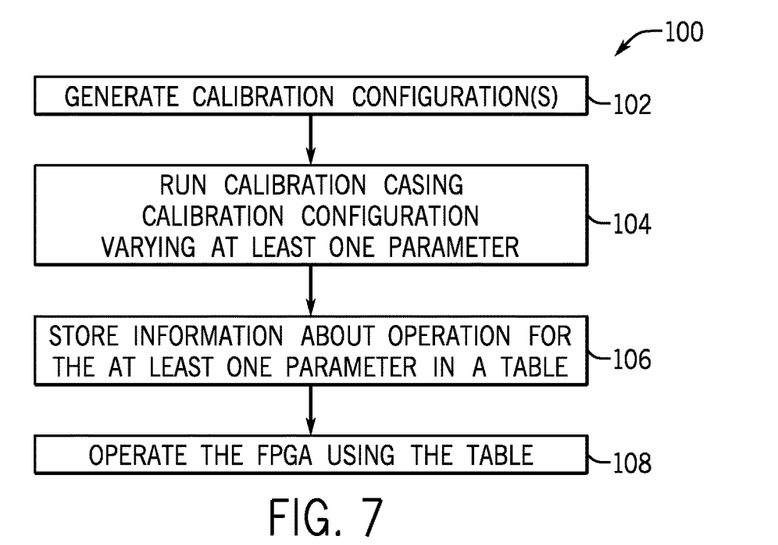
FIG. 7 illustrates a flow diagram illustrating a process for operating the FPGA system of FIG. 1 using dynamic operating parameters based at least in part on the calibration configurations of FIG. 6.

FIG. 7 illustrates a process 100 for dynamically varying a parameter of operation of the system 10. The process 100 includes generating one or more calibration configurations using the design software 14 (block 102). For example, the calibration configurations may be generated using the process 80 previously discussed. Once the calibration configuration(s) are generated, the DVFS calibration control 22 runs a calibration using the calibration configurations. For example, the DVFS calibration control 22 may determine, for each temperature tested, a minimum working voltage and a maximum frequency at each voltage, as previously discussed in reference to FIGS. 3A & 3B. Additionally or alternatively, the DVFS calibration control 22 may determine a lowest voltage possible for each frequency at each temperature tested. Furthermore, the DVFS calibration control 22 may track additional parameters, such as current from the power supply either as average current and/or transient current. The DVFS calibration control 22 may also track the frequency of the transiency of the current.

The DVFS calibration control 22 tracks this information and stores it in the calibration table (CT) 24 (block 106). For example, the calibration table 24 may include a lookup table that indicates minimum and/or maximum voltage, temperature of die, frequency of the clock, transient and/or average current of the power supply, frequency of transiency of the current of the power supply, and/or other operating parameters of the integrated circuit 12 as a table having one or more dimensions. Using the information stored in the calibration table 24, the DVFS calibration control 22 operates the integrated circuit 12 using the design 13 to reduce power consumption of the integrated circuit 12 during operation.

Figure 8:
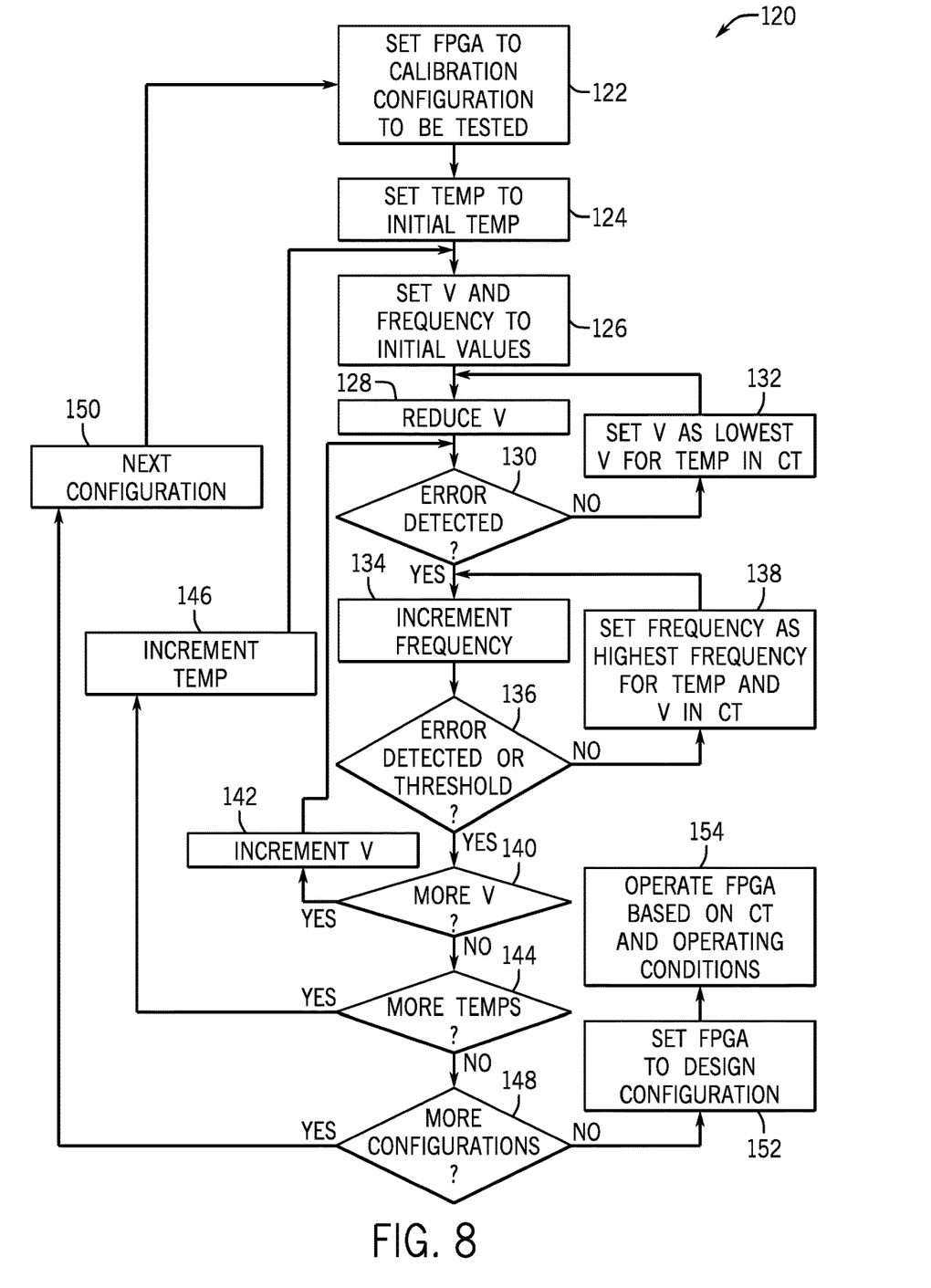
FIG. 8 illustrates a flow diagram illustrating a detailed process for operating the FPGA system of FIG. 1 using dynamic voltage and frequency parameters based at least in part on the calibration configurations of FIG. 6.

FIG. 8 illustrates a detailed flow diagram view of a process 120 for dynamically varying temperature, voltage, and frequency. The FPGA is set to one of a number of calibration configurations to be tested (block 122). For example, the calibration configurations may be determined using the process 80 of FIG. 6. Once the FPGA is set to the calibration configuration, a temperature for the die to be tested is set (block 124). For example, the DVFS calibration control 22 may cause a number of heaters 70 to be set to achieve a desired temperature. For instance, the initial temperature may be a base temperature that not elevated by any of the heaters. In other words, the initial temperature may be that which is achieved without additional heating. Furthermore, the DVFS calibration control 22 can verify what the initial temperature is by using the DVFS parameter sensor(s) 18 to determine the temperature as a DVFS parameter 20.

The DVFS calibration control 22 also sets voltage and frequency to initial values (block 126). The initial voltage may be a pessimistic voltage that is likely to cause the integrated circuit 12 to function properly even in worst-case scenarios of temperature and frequency. The frequency may be similarly selected as a pessimistic worst-case scenario for temperature and the initial voltage. The voltage then is reduced incrementally (block 128). The DVFS calibration control 22 tracks whether an error has been detected (block 130). For example, the DVFS calibration control 22 may track when an error signal is received from the error checkers. Specifically, when data at the error checkers 76 does not match expected results from data injected into a respective critical path 72. If no error is detected, the current voltage may be stored in the calibration table 24 as the lowest voltage for the current temperature (block 132). In some embodiments, the lowest voltage may be stored relative to the temperature and the frequency. Moreover, in some embodiments, the lowest voltage may not be stored for each voltage that is error-free, and instead, only the last lowest working voltage is stored after the first failing voltage occurs. In some embodiments, a lowest working voltage may be automatically set to some voltage or may be cut off at some threshold where even best-case scenarios are likely to fail. In some embodiments, storing the lowest voltage causes the calibration table to mark all voltages below the lowest voltage as impermissible for the temperature and all voltages above as permissible. In some embodiments, the lowest voltage and the highest voltage may both be determined for the temperature and all voltages outside this range are deemed as error-prone voltages.

Once the lowest voltage to be tested has been established, the DVFS calibration control 22 cycles through frequency values of the clock 58 to determine a fastest clock that is error-free for the current voltage and temperature. To this end, the DVFS calibration control 22 increments the frequency (block 134) until an error is detected or a maximum frequency threshold has been surpassed (block 136). The maximum frequency threshold may correspond to a maximum desired frequency due to constraints on the system 10 such as physical limitations of the integrated circuit 12 and/or the clock 58. Similar to the lowest voltage, the highest and last working frequency may be set in the calibration table 24 as corresponding to the temperature and current (block 138). Also similar to the lowest voltage, the highest frequency may be stored as each frequency is tested or only written as the last working frequency when a first error is detected at the next frequency tested. In some embodiments, storing the highest frequency causes the calibration table to mark all frequencies above the highest frequency as impermissible for the temperature and voltage and all frequencies below as permissible frequencies (though some frequencies below a slower threshold may be deemed impermissible as slowing the FPGA to an undesireable extent.

Once the highest frequency is set in the calibration table 24 for the temperature and voltage, the CVFS calibration controller 22 determines if more voltages are to be tested (block 140). This determination may be made based on whether the calibration table 24 is fully populated for the current temperature and/or if a previous voltage worked for at least some frequencies, the next frequency may be tested. If more voltages are to be tested, the voltage is incremented and the frequency is reset to the initial value (block 142). However, if no voltages are to be tested, the CVFS calibration control 22 determines whether additional temperatures are to be tested (block 144). Similar to the determination of whether additional voltages are to be tested, the additional temperature determination may be based on whether the calibration table 24 is fully populated and/or if a previous temperature worked for at least some voltages, the next frequency may be tested. Once all temperatures have been tested, a determination is made whether additional configurations are to be tested (block 148). Specifically, if all critical paths to be tested cannot be tested in parallel, more than one generated calibration configuration may exist. If another configuration is to be tested, the next configuration is selected 150, and the process 120 begins again for the new calibration configuration.

If no more configurations exist, the FPGA is set to the design configuration (block 152). The FPGA is then ready to operate in the design configuration based at least in part on the calibration table 24 and measured operating conditions (block 154). In some embodiments, the calibration table 24 may be modified by some guardband to ensure that any operating parameters are more likely to result in proper operation of the integrated circuit 12. For example, the guardband may include 5% modulators the increase or decrease acceptable conditions, such as an increase to voltage and/or a decrease in frequency at specific temperatures. In some embodiments, this modulation of the values in the calibration table 24 may include other modulated values, such as 1%, 2%, 3%, 4%, or more than 5%. In some embodiments, the guardband may be determined dynamically by the design software 14 based on analysis of the worst-case variation in a critical path due to parameters such as crosstalk that may not be calibrated (e.g., cannot be repetitively reproduced). The analysis takes into account an amount of delay variation that is due to crosstalk on each path and a corresponding timing slack to produce a guardband. For example, the design software 14 may determine a maximum delay variation for all critical paths of the design 13.

Moreover, although the foregoing process 120 discusses populating a calibration table by scanning through temperature, voltage and frequency in a single cycle, some embodiments of the process 120 may split voltage and frequency scans into separate cycles by cycling through each voltage for each temperature in a first past and a second pass of each frequency for each temperature and voltage.

Note that temperature, voltage, and frequency cycling, in such order, have been discussed above for clarity, but any parameters that affect integrated circuit 12 operation may be tested in such a manner. In other words, the temperature, voltage, and frequency may each respectively be replaced by or supplemented with minimum and/or maximum voltage, temperature of die, frequency of the clock, transient and/or average current of the power supply, frequency of transiency of the current of the power supply, and/or other operating parameters even including rearrangement of the testing of the temperature, voltage, and frequency.

While the embodiments set forth in the present disclosure may be susceptible to various modifications and alternative forms, specific embodiments have been shown by way of example in the drawings and have been described in detail herein. However, it should be understood that the disclosure is not intended to be limited to the particular forms disclosed. The disclosure is to cover all modifications, equivalents, and alternatives falling within the spirit and scope of the disclosure as defined by the following appended claims.

The invention claimed is:

1. An integrated circuit system comprising:
a field programmable logic fabric; and
a dynamic parameter scaling controller that:
tracks, for reduction of power consumption of the field programmable logic fabric, an operating parameter as a function of an operating condition by maintaining the operating parameter while cycling through the operating condition during a calibration mode using an end-user-specific calibration configuration for the field programmable logic fabric, the operating condition comprising at least one of temperature and load current, the operating parameter comprises at least one of voltage and frequency, wherein the tracking of the operating parameter performed on speed limiting paths specific to the end-user's application;

stores one or more functional values for the operating parameter in a calibration table; and operates the field programmable logic fabric using a design configuration using dynamic values for the operating parameter in the calibration table.

2. The integrated circuit system of claim 1, wherein the dynamic parameter scaling controller tracks the operating parameter by periodically incrementing temperature until a temperature threshold has been reached.

3. The integrated circuit system of claim 1, wherein storing the one or more functional values in the calibration table comprises indicating whether a voltage is functional at a specific value for the operating condition.

4. The integrated circuit system of claim 1, wherein storing the one or more functional values in the calibration table comprises storing a lowest voltage that is functional at a specific value for the operating condition.

5. The integrated circuit system of claim 1, wherein the dynamic parameter scaling controller modifies values in the calibration table to implement a guardband that modifies the stored one or more functional values by increasing or decreasing one or more functional values away from an error condition direction.

6. The integrated circuit system of claim 5, wherein the guardband comprises a consistent modifier percentage that modifies the one or more functional values by a percentage of the functional value.

7. The integrated circuit system of claim 1, wherein the end-user-specific calibration configuration for the field programmable logic fabric comprises replicas of the speed limiting paths specific to the end-user, using the same physical resources, to determine speed of the speed limiting paths.

8. The integrated circuit system of claim 1, wherein the speed limiting paths comprise programmable routing and logical blocks.

9. The integrated circuit system of claim 1, wherein the speed limiting paths comprise logical blocks.

10. A method for operating a field programmable logic fabric using dynamic parameter scaling comprising:

generating an end-user-specific calibration configuration for the field programmable logic fabric;

tracking, for reduction of power consumption of the field programmable logic fabric, an operating parameter as a function of an operating condition by maintaining the operating parameter while cycling through the operating condition during a calibration mode, using the calibration configuration for the field programmable logic fabric, the operating condition comprising at least one of temperature and load current, the operating parameter comprises at least one of voltage and frequency, wherein the tracking of the operating parameter performed on speed limiting paths specific to the end-user's application;

storing one or more functional values for the operating parameter in a calibration table; and operating the field programmable logic fabric using a design configuration using dynamic values for the operating parameter in the calibration table.

11. The method of claim 10, wherein generating the calibration configuration comprises:

obtaining critical path information for an operating configuration of the field programmable logic fabric, the critical path information comprising the speed limiting paths specific to the end-user's application; and using the critical path information with the calibration configuration for the tracking of the operating parameter.

12. The method of claim 10, wherein generating the calibration configuration comprises generating a plurality of calibration configurations.

13. The method of claim 12, wherein generating the plurality of calibration configurations comprises:

obtaining critical path information for an operating configuration of the field programmable logic fabric, the critical path information comprising the speed limiting paths specific to the end-user's application;

for the set of critical paths derived from the critical path information:

determining whether each respective critical path of the number of critical paths fits into a first calibration configuration of the plurality of calibration configurations;

when the respective critical path fits into the first calibration configuration, using the critical path information with the first calibration configuration; and when the respective critical path does not fit into the first calibration configuration, using the critical path information with a subsequent calibration configuration of the plurality of calibration configurations.

14. One or more non-transitory, tangible, machine-readable media storing instructions executable by a controller that controls an integrated circuit device comprising a field programmable logic fabric, wherein the instructions cause the controller to:

during a calibration period, control the integrated circuit device to operate under a simulated future operating condition for reduction of power consumption of the field programmable logic fabric, while tracking an operating parameter of the integrated circuit device in relation to a behavior of the integrated circuit device as the simulated future operating condition changes, the operating condition comprising at least one of temperature and load current, the operating parameter comprises at least one of voltage and frequency, wherein the tracking of the operating parameter is for speed limiting paths specific to the end-user's application; and during an operation period after the calibration period, operate the integrated circuit device at least in part by adjusting the operating parameter based at least in part on actual operating condition as compared to the simulated future operating condition.

15. The non-transitory, computer-readable medium of claim 14, wherein controlling the integrated circuit device comprises modifying an amount of heat generated by a heating element located on the integrated circuit device, the heating element comprising reprogrammed circuitry in the integrated circuit device that is not used for critical paths.

* * * * *